United States Patent [19]

Moench

[11] 4,146,802
[45] Mar. 27, 1979

[54] SELF LATCHING BUFFER

[75] Inventor: Jerry D. Moench, Austin, Tex.

[73] Assignee: Motorola, Inc., Schaumburg, Ill.

[21] Appl. No.: 834,733

[22] Filed: Sep. 19, 1977

[51] Int. Cl.² .................... H03K 3/286; H03K 3/353; G11C 8/00
[52] U.S. Cl. ............................... 307/279; 307/200 B; 307/270; 307/DIG. 1; 365/230
[58] Field of Search .................... 307/200 B, 264, 270, 307/279, DIG. 1, 5; 365/230, 231, 233

[56] References Cited

U.S. PATENT DOCUMENTS

| 3,795,898 | 3/1974 | Mehta et al. ........................ 365/230 |
| 3,796,893 | 3/1974 | Hoffman et al. ................. 307/279 X |
| 3,848,237 | 11/1974 | Geilhufe .................... 307/DIG. 1 X |
| 3,902,082 | 8/1975 | Proebsting et al. ................... 307/279 |
| 3,906,464 | 9/1975 | Lattin ............................... 307/279 X |
| 3,959,781 | 5/1976 | Mehta et al. ..................... 365/233 X |
| 3,969,706 | 7/1976 | Proebsting et al. ................... 365/230 |
| 4,038,567 | 7/1977 | Lewis et al. ............... 307/DIG. 1 X |
| 4,038,646 | 7/1977 | Mehta et al. ................ 307/DIG. 1 X |
| 4,074,148 | 2/1978 | Sato ........................... 307/DIG. 1 X |
| 4,077,031 | 2/1978 | Kitagawa et al. ............... 307/279 X |

Primary Examiner—Larry N. Anagnos
Attorney, Agent, or Firm—Joe E. Barbee

[57] ABSTRACT

A latching circuit with at least one node which is precharged by a precharge signal and discharged by the latching of a particular state in the latch. The at least one node is fed back to a control electrode of a transistor which is in series with an input terminal of the latching circuit. The feedback from the at least one node controls operation of the series transistor so that an input signal appearing on the input terminal can be locked out when the latching circuit has a desired logic signal latched into it.

15 Claims, 2 Drawing Figures

SELF LATCHING BUFFER

BACKGROUND OF THE INVENTION

This invention relates, in general, to logic latching circuits and more particularly, to a self latching circuit useful as a buffer.

In many applications in digital circuitry it is necessary to provide a certain degree of isolation from one circuit to another. It is customary in such a situation to use a circuit that is called a buffer to provide the desired isolation. Furthermore, besides providing the buffering the circuit is also sometimes required to temporarily hold the data. While the circuit is holding the data it is often desired to prevent further input data from disrupting the data within the buffer. Therefore buffers have been provided with a latching feature which allows the buffer to latch in the data that is within the buffer and to latch out any subsequent data appearing at the input of the buffer until the receiving circuit has had an opportunity to receive the data from the buffer.

Such a latching buffer is particularly useful as an input to a computer memory to provide buffering between the computer memory and other circuitry. In addition, a latching buffer is also useful in providing buffering between a computer memory and addressing circuitry which carries an input address to the memory. In the past, such latching buffers required an external generated signal to control an internal portion of the latching buffer thereby preventing subsequent input data from disturbing a preset state of the latching buffer. Of course, the generation of the external signal requires additional hardware to generate this signal and additional wiring within the system to carry the signal up to the latching buffer. By now, it should be appreciated that it would be desirable to provide a latching buffer which does not require an external input signal to provide the latching function.

Accordingly, it is an object of the present invention to provide an improved latching buffer which is self latching.

Another object of the present invention is to provide a self latching buffer which uses feedback from the buffer itself to latch the buffer in a predetermined state and to latch out any further data from coming into the buffer.

SUMMARY OF THE INVENTION

In carrying out the above and other objects of the present invention there is provided a latching buffer having at least one node which is precharged by a precharge signal and discharged by the latching of a particular state in the latching buffer. The at least one node provides feedback to the control electrode of a transistor which is in series with an input terminal to the latching buffer.

In a preferred embodiment of the invention all the active devices of the latching buffer are metal oxide semiconductor (MOS) field effect transistors (FET).

The subject matter which is regarded as the invention is set forth in the appended claims. The invention itself, however, together with further objects and advantages thereof, may be better understood by referring to the following detailed description taken in conjunction with the accompanying drawings.

The exemplifications set out herein illustrate the preferred embodiment of the invention in one form thereof, and such exemplifications are not to be construed as limiting in any manner.

DESCRIPTION OF THE PREFERRED EMBODIMENTS

Figure 1:
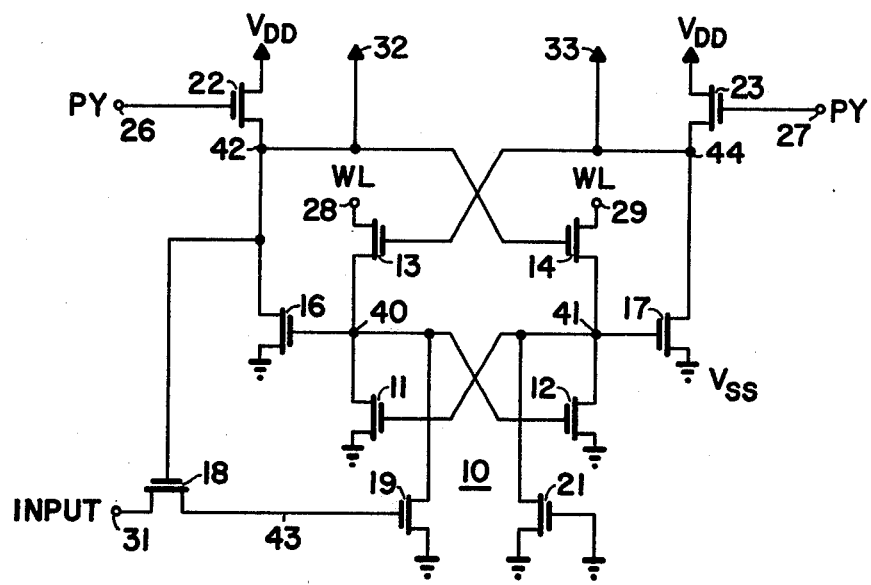
FIG. 1 is a schematic diagram of an embodiment of the invention.

A self latching buffer 10 is illustrated in FIG. 1. In the preferred embodiment, self latching buffer 10 uses field effect transistors. Transistors 11 and 12 are interconnected in a flip-flop arrangement wherein transistor 13 serves as a load for transistor 11 and transistor 14 serves as a load for transistor 12. A control electrode of transistor 11 is connected to an electrode of transistor 12 to form a node 41. A control electrode of transistor 12 is connected to an electrode of transistor 11 to form node 40. Transistor 16 has an electrode connected to the control electrode of transistor 14 to form node 42 while the control electrode of transistor 16 is connected to node 40. Transistors 17 and 23 are connected in series between a power supply $V_{DD}$ and a reference potential commonly called $V_{SS}$. The control electrode of transistor 17 is connected to node 41. Transistor 23 has an electrode connected to the control electrode of transistor 13. The control electrode of transistor 23 is connected to a line 27 and receives a signal PY which is used to precharge the circuit as will be discussed hereinafter. A transistor 22 appears in series with transistor 16 between voltage supply $V_{DD}$ and its return reference, $V_{SS}$. The control electrode for transistor 22 is connected to line 26 to receive the signal PY which is the same signal appearing on line 27. Transistors 13 and 14 each have an electrode connected respectively to lines 28 and 29 to receive a signal WL. An electrode of transistor 16 is connected to the control electrode of transistor 18. Transistor 18 appears in series between input line 31 and transistor 19. Transistor 19 serves as an input transistor to the latch circuit. Transistor 19 has an electrode connected to node 40. A transistor 21 is used to provide capacitance balance to buffer 10 and has an electrode connected to node 41 while its other electrode is connected to its control electrode and to ground reference.

The outputs for buffer 10 appear on lines 32 and 33. The outputs appearing on lines 32 and 33 will of course be complements of each other and in most memory systems will go to another circuit where they are gated into the memory itself.

When an input is not present on line 31, and the PY signal is present on lines 26 and 27, transistors 22 and 23 will conduct thereby charging nodes 42 and 44 to a logic "1" level. This is commonly called precharging the latching buffer. Since the control electrodes of transistors 13 and 14 are connected to nodes 44 and 42, respectively, when a signal WL is applied to lines 28 and 29 transistors 13 and 14 will conduct. Preferably transistor 13 has a higher gain than transistor 14 and therefore the effects of signal WL being present on lines 28 and 29 will cause node 40 to rise to a logic "1" level quicker than node 41. Of course, the logic "1" on node 40 is sensed by the control electrode of transistor 12 which causes transistor 12 to conduct. Conduction of transistor 12 has the effect of maintaining node 41 at a logic "0" level. This logic "0" level is coupled to the control electrode of transistor 17 which maintains transistor 17 in an "off" condition so that node 44 remains at a logic "1" level keeping transistor 28 in a conductive state. The logic "0" appearing at node 41 is also connected to the control electrode of transistor 11 and keeps transistor 11 in a nonconductive state so that the logic "1" level appearing at node 40 is not destroyed. The control electrode of transistor 16 senses a logic "1" level at node 40 thereby placing transistor 16 in a conductive state which causes node 42 to go to a logic "0" level. Node 42 is connected to the control electrode of transistor 14. The logic "0" of node 42 is also coupled to the control electrode of transistor 18 to maintain transistor 18 in an "off" or nonconductive state. Since transistor 18 is in a nonconductive state a subsequent signal appearing on the input line 31 will not be coupled by line 43 to transistor 19. Accordingly, latching buffer 10 is now in a latched state having a logic "0" on output line 32 and a logic "1" on output line 33. Buffer 10 will tend to maintain this state until the circuit is precharged once again. In the meanwhile, transistor 18 latches out any further input signals and it can now be seen that latching buffer 10 has latched a logic "1" at node 40 and has latched out any further inputs.

If a logic "1" signal level is present on input line 31 when the precharge signal, PY, appears on lines 26 and 27 transistor 22 will conduct thereby causing node 42 to go towards a logic "1" level. This node 42 is connected to the control electrode of transistor 18 and will cause transistor 18 to conduct thereby allowing the logic "1" level on input line 31 to appear on line 43 which goes to the control electrode of transistor 19. Transistor 19 will then conduct placing a logic "0" at node 40. Now, when signal WL appears at lines 28 and 29, node 41 will go to a logic "1" level while node 40 is being held at a logic "0" level by conduction of transistor 19. Since a logic "0" is at node 40, transistor 16 will not conduct thereby causing node 42 to remain at a logic "1" while transistor 17 will conduct because of the logic "1" level on node 41. Conduction of transistor 17 causes node 44 to go to a logic "0" level thereby causing outputs 32 and 33 to have a logic "1" and a logic "0", respectively.

Figure 2:
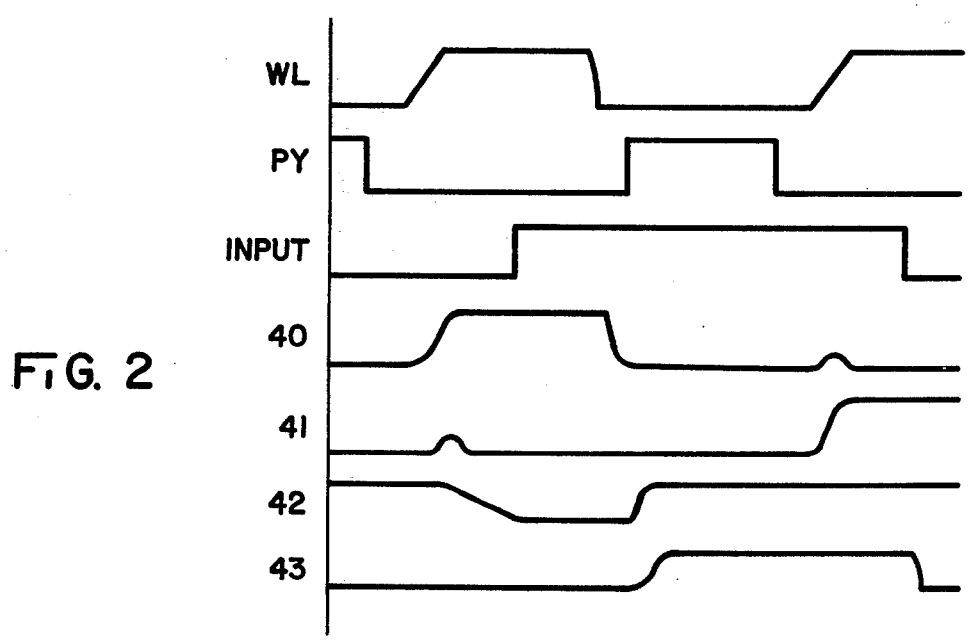
FIG. 2 is a timing waveform diagram helpful in understanding the operation of the circuit in FIG. 1.

The timing diagram illustrated in FIG. 2 may be helpful in further understanding the above explanation of the operation of latching buffer 10. The top waveform is signal WL which appears on lines 28 and 29. The second waveform is precharging signal PY which appears at lines 26 and 27. The third waveform from the top is the input signal which appears on line 31. The other waveforms 40, 41, 42, and 43 are the waveforms on nodes 40, 41, 42, and 43 respectively. As can be seen in FIG. 2 when the signal WL is at a high or logic "1" level both nodes 40 and 41 start to increase towards a logic "1" level, however, as explained hereinbefore node 40 reaches the logic "1" level faster thereby causing transistor 12 to conduct and holding node 41 at a logic "0" level. FIG. 2 also illustrates the behavior of nodes 40 and 41 when a logic input signal is present on line 31 during precharge. The precharging, of course, occurs when signal PY is at a logic "1" level. Throughout the explanation of the operation of the circuit it is assumed that a logic "1" is a "high" voltage level while a logic "0" is a "low" voltage level.

By now it should be appreciated that there has been provided a self latching buffer which latches in a predetermined logic state while at the same time latching out a logic "1" from entering the buffer. All this is accomplished without requiring an additional external input signal to perform the latching out function.

By way of example only, the following field effect transistor sizes are given for the transistors illustrated in FIG. 1:

| Transistor 11 | 20/8 |
| Transistor 12 | 20/8 |
| Transistor 13 | 14/10 |
| Transistor 14 | 10/10 |
| Transistor 16 | 20/8 |
| Transistor 17 | 20/8 |
| Transistor 18 | 10/7 |
| Transistor 19 | 70/7 |
| Transistor 21 | 70/7 |
| Transistor 22 | 25/7 |
| Transistor 23 | 25/7 |

As is well understood by those persons skilled in the art, the above ratios give the size of the field effect transistors wherein the top number is the width of the source and drain electrodes of the transistor while the lower number is the distance between the source and drain for each transistor. Of course the dimension for all the numbers is in microns. Note the difference in size between transistors 13 and 14 which is useful in the operation of the circuit as pointed out hereinbefore.

Consequently, while in accordance with the patent statutes there has been described what at present is considered to be the preferred form of the invention it will be obvious to those skilled in the art that numerous changes and modifications may be made herein without departing from the spirit and scope of the invention, and it is therefore aimed that the following claims cover all such modifications.

What is claimed as new and desired to secure by Letters Patent of the United States is:

1. A self latching input buffer comprising: a first and a second flip-flop transistor interconnected to form a flip-flop; a first and a second load transistor, the first load transistor being connected in series with the first flip-flop transistor and forming a first junction therebetween, the second load transistor being connected in series with the second flip-flop transistor and forming a second junction therebetween, the first and second load transistors being substantially unbalanced in size and characteristic; means coupled to turn on the first and second load transistors at a predetermined time and to turn off the first and second load transistors after a preselected period; a first discharge transistor connected to the first junction formed by the first flip-flop transistor and the first load transistor; a second discharge transistor connected to the second junction formed by the second flip-flop transistor and the second load transistor; an input transistor coupled to the first junction formed by the first flip-flop transistor and the first load transistor, the input transistor being coupled to an input terminal; and a latch-out transistor coupling the input terminal to the input transistor, the latch-out transistor having a control electrode coupled to an output electrode of the first discharge transistor so that the latch-out transistor can prevent an input signal from entering the buffer during a predetermined time period.

2. The self latching input buffer of claim 1 further having a balancing transistor connected to the second junction formed by the second flip-flop transistor and the second load transistor.

3. The self latching input buffer of claim 2 wherein all the transistors are field effect transistors.

4. A self latching buffer being capable of being used with a digital memory device, comprising: a first and a second transistor interconnected in a flip-flop arrangement; a third and a fourth transistor to serve as load transistors for the first and second transistors respectively, the third and fourth transistors being unbalanced in size and characteristic; means coupled to the third and fourth transistors to turn on the third and fourth transistors at a predetermined time and to turn off the third and fourth transistors after a preselected period; means controlled by the flip-flop arrangement and coupled to the third and fourth transistors to disable the third and fourth transistors; a fifth transistor coupled to the first and third transistors and to an input terminal, the fifth transistor having a control electrode; and a sixth transistor coupling the input terminal to the control electrode of the fifth transistor to prevent an input from reaching the fifth transistor during a predetermined time period.

5. The buffer of claim 4 wherein all the transistors are field effect transistors.

6. The buffer of claim 4 wherein the means controlled by the flip-flop arrangement comprises two transistors each having a control electrode connected to the flip-flop arrangement.

7. The buffer of claim 6 wherein the third transistor has a higher gain than the fourth transistor.

8. The buffer of claim 6 wherein the sixth transistor has a control electrode coupled to the means controlled by the flip-flop arrangement so that when the flip-flop is in a predetermined state the sixth transistor prevents the input from reaching the fifth transistor.

9. A self latching buffer being capable of buffering an input to a digital memory device, comprising: a first transistor having a first and a second electrode and a control electrode; a second transistor having a control electrode coupled to the first electrode of the first transistor, a first electrode coupled to the control electrode of the first transistor, and a second electrode coupled to the second electrode of the first transistor; a third transistor having a first and a second electrode and a control electrode, the second electrode being coupled to the first electrode of the first transistor; a fourth transistor having a first and a second electrode and a control electrode, the first electrode being coupled to the first electrode of the third transistor, the second electrode being coupled to the first electrode of the second transistor; a fifth transistor having a first and a second electrode and a control electrode, the second electrode being coupled to the second electrode of the first transistor, the control electrode being coupled to the first electrode of the first transistor, the first electrode being coupled to the control electrode of the fourth transistor; a sixth transistor having a first and a second electrode and a control electrode, the control electrode is coupled to the first electrode of the second transistor, the second electrode is coupled to the second electrode of the second transistor, the first electrode is coupled to the control electrode of the third transistor; a seventh transistor having a first and a second electrode and a control electrode, the first electrode being coupled to the first electrode of the first transistor and the second electrode being coupled to the second electrode of the first transistor; an eighth transistor having a first and a second electrode and a control electrode, the first electrode being coupled to an input terminal and the second electrode being coupled to the control electrode of the seventh transistor, the control electrode being coupled to the first electrode of the fifth transistor; and means for applying a timed signal to a junction formed by the first electrode of the fifth transistor and the control electrode of the fourth transistor and to a junction formed by the first electrode of the sixth transistor and the control electrode of the third transistor thereby providing a buffer which is self latching and prevents an input signal from disrupting a desired state of the buffer.

10. The self latching buffer of claim 9 further having a ninth transistor having a first and a second electrode and a control electrode, the first electrode being coupled to the first electrode of the second transistor, and the second electrode and control electrode being coupled to the second electrode of the second transistor.

11. The self latching buffer of claim 10 wherein all the transistors are field effect transistors.

12. The self latching buffer of claim 11 wherein the third and fourth transistors are unbalanced in gain so that a voltage placed on the first electrodes of the transistors will appear on the second electrode of one before it will appear on the second electrode of the other when the third and fourth transistors are enabled.

13. A self latching buffer for buffering an input to a digital memory device, comprising: a first and a second transistor interconnected to form a flip-flop; a third and a fourth transistor each having a control electrode, the third and fourth transistors being coupled to the first and second transistors respectively, to serve as loads for the first and second transistors; means for providing a timed signal to the control electrodes of the third and fourth transistors; a fifth transistor coupled to the fourth transistor for removing any signal on its control electrode when the flip-flop is in a predetermined state; a sixth transistor coupled to the control electrode of the third transistor to remove any signal on its control electrode; a seventh transistor coupled in parallel with the first transistor to provide an input signal to the flip-flop; an eighth transistor coupled between a control electrode of the seventh transistor and an input terminal to latch out any input during a preselected period, the eighth transistor having a control electrode coupled to the fifth transistor so that the eighth transistor is enabled by internal action of the buffer; and output means coupled to the control electrodes of the third and fourth transistors for supplying outputs from the buffer.

14. The self latching buffer of claim 13 wherein all the transistors are MOS field effect transistors.

15. The self latching buffer of claim 14 further having a ninth transistor in parallel with the second transistor to provide circuit characteristic balance to the buffer.

* * * * *